United States Patent
Göötz et al.

(10) Patent No.: US 11,329,199 B2
(45) Date of Patent: May 10, 2022

(54) OPTOELECTRONIC SEMICONDUCTOR CHIP, METHOD OF MANUFACTURING AN OPTOELECTRONIC COMPONENT AND OPTOELECTRONIC COMPONENT

(71) Applicant: OSRAM OLED GmbH, Regensburg (DE)

(72) Inventors: Britta Göötz, Regensburg (DE); Matthias Hien, Kirchroth (DE); Andreas Dobner, Wenzenbach (DE); Peter Brick, Regensburg (DE); Matthias Goldbach, Pentling (DE); Uli Hiller, Bad Abbach (DE); Sebastian Stigler, Scharmassing (DE)

(73) Assignee: OSRAM OLED GMBH, Regensburg (DE)

( * ) Notice: Subject to any disclaimer, the term of this patent is extended or adjusted under 35 U.S.C. 154(b) by 183 days.

(21) Appl. No.: 16/762,056

(22) PCT Filed: Jan. 24, 2019

(86) PCT No.: PCT/EP2019/051753
§ 371 (c)(1),
(2) Date: May 6, 2020

(87) PCT Pub. No.: WO2019/145422
PCT Pub. Date: Aug. 1, 2019

(65) Prior Publication Data
US 2020/0343419 A1    Oct. 29, 2020

(30) Foreign Application Priority Data
Jan. 26, 2018 (DE) .......................... 102018101781.2
May 15, 2018 (DE) .......................... 102018111637.3

(51) Int. Cl.
*H01L 33/50* (2010.01)
*H01L 25/075* (2006.01)
*H01L 33/60* (2010.01)

(52) U.S. Cl.
CPC ........ *H01L 33/504* (2013.01); *H01L 25/0753* (2013.01); *H01L 33/60* (2013.01);
(Continued)

(58) Field of Classification Search
CPC ... H01L 27/3246; H01L 33/58; H01L 33/145; H01L 33/507; H01L 2933/0041
See application file for complete search history.

(56) References Cited

U.S. PATENT DOCUMENTS 8,426,875 B2    4/2013    Singer et al.
9,018,661 B2    4/2015    Pindl et al.
(Continued)

FOREIGN PATENT DOCUMENTS

DE    102008011153 A1    5/2009
DE    102011003969 A1    8/2012
(Continued)

*Primary Examiner* — Andrew J Coughlin
(74) *Attorney, Agent, or Firm* — Slater Matsil, LLP

(57) ABSTRACT

An optoelectronic semiconductor chip, a method for manufacturing an optoelectronic component and an optoelectronic component are disclosed. In an embodiment an optoelectronic semiconductor chip includes a semiconductor layer sequence having an emission side, the emission side comprising a plurality of emission fields, partition walls on the emission side in a region between two adjacent emission fields and a conversion element on one or more emission fields, wherein the conversion element includes a matrix material with first phosphor particles incorporated therein, wherein the first phosphor particles are sedimented in the matrix material such that a mass fraction of the first phosphor particles is greater in a lower region of the conversion element facing the semiconductor layer sequence than in a
(Continued)

remaining region of the conversion element, and wherein the partition walls are attached to the emission side without any additional connectors.

20 Claims, 12 Drawing Sheets

(52) U.S. Cl.
CPC ............... *H01L 2933/0041* (2013.01); *H01L 2933/0058* (2013.01)

(56) References Cited

U.S. PATENT DOCUMENTS

| | | |
|---|---|---|
| 9,406,847 B2 | 8/2016 | Markytan et al. |
| 10,505,085 B2 | 12/2019 | von Malm |
| 10,586,827 B2 | 3/2020 | Gootz et al. |
| 10,816,850 B2 * | 10/2020 | Zha .................. G02F 1/133606 |
| 2011/0121731 A1 | 5/2011 | Tsutsumi et al. |
| 2013/0322067 A1 | 12/2013 | Tien et al. |
| 2017/0069800 A1 * | 3/2017 | Gootz .................. H01L 33/005 |
| 2017/0309794 A1 | 10/2017 | Von Malm |
| 2019/0189595 A1 * | 6/2019 | Lee ....................... H01L 33/504 |
| 2020/0119237 A1 * | 4/2020 | Kim .................. G02F 1/133512 |

FOREIGN PATENT DOCUMENTS

| | | |
|---|---|---|
| DE | 102014108282 A1 | 12/2015 |
| DE | 102014112551 A1 | 3/2016 |
| DE | 102015103055 A1 | 6/2016 |
| WO | 2014023617 A1 | 2/2014 |
| WO | 2015063077 A1 | 5/2015 |

* cited by examiner

OPTOELECTRONIC SEMICONDUCTOR CHIP, METHOD OF MANUFACTURING AN OPTOELECTRONIC COMPONENT AND OPTOELECTRONIC COMPONENT

This patent application is a national phase filing under section 371 of PCT/EP2019/051753, filed Jan. 24, 2019, which claims the priority of German patent application 102018111637.3, filed May 15, 2018, which claims the priority of German patent application 102018101781.2, filed Jan. 26, 2018, each of which is incorporated herein by reference in its entirety.

TECHNICAL FIELD

An optoelectronic semiconductor chip is specified. In addition, a method of manufacturing an optoelectronic component and an optoelectronic component are specified.

SUMMARY

Embodiments provide a pixelated optoelectronic semiconductor chip with optically clearly separated pixels and high colour homogeneity within the individual pixels. Other embodiments provide an optoelectronic component with high colour homogeneity. Yet other embodiments provide a method of manufacturing of such an optoelectronic component, in particular such an optoelectronic semiconductor chip.

According to at least one embodiment, the optoelectronic semiconductor chip comprises a semiconductor layer sequence with an emission side, the emission side comprising a plurality of emission fields. The semiconductor chip can emit radiation during intended operation.

Here and in the following a semiconductor chip is understood to be an element that can be handled separately and can be electrically contacted separately. A semiconductor chip is formed in particular by separation from a wafer compound. In particular, the side surfaces of a semiconductor chip then show traces from the separation process of the wafer compound, for example. A semiconductor chip preferably comprises exactly one originally contiguous region of the semiconductor layer sequence grown in the wafer compound. The semiconductor layer sequence of the semiconductor chip is preferably formed contiguously. The optoelectronic semiconductor chip comprises a contiguous or a segmented active layer. The lateral extension of the semiconductor chip, measured parallel to the main extension direction of the active layer, is, for example, at most 1% or at most 5% larger than the lateral extension of the active layer or of the semiconductor layer sequence.

The semiconductor chip may also include the growth substrate on which the semiconductor layer sequence is grown. In this case it is, for example, a so-called volume emitter.

Alternatively, the growth substrate for the semiconductor layer sequence can also be removed. In this case it is, for example, a so-called thin film chip or surface emitter.

The semiconductor layer sequence comprises an active layer for generating electromagnetic radiation. The semiconductor layer sequence is based on a III-V compound semiconductor material, for example. The semiconductor material is, for example, a nitride compound semiconductor material, such as $Al_n In_{1-n-m} Ga_m N$, or a phosphide compound semiconductor material, such as $Al_n In_{1-n-m} Ga_m P$, or an arsenide compound semiconductor material, such as $Al_n In_{1-n-m} Ga_m As$ or $Al_n In_{1-n-m} Ga_m AsP$, where $0 \leq n \leq 1$, $0 \leq m \leq 1$ and $m+n \leq 1$ respectively. The semiconductor layer sequence may contain dopants and additional components. For the sake of simplicity, however, only the essential constituents of the crystal lattice of the semiconductor layer sequence, i.e., Al, As, Ga, In, N or P, are given, even if these may be partially replaced and/or supplemented by small amounts of other substances. Preferably the semiconductor layer sequence is based on AlInGaN.

The active layer of the semiconductor layer sequence contains in particular at least one pn junction and/or at least one quantum well structure and can, for example, generate electromagnetic radiation in the blue or green or red spectral range or in the UV range during normal operation. For example, the semiconductor chip comprises one, in particular exactly one, contiguous active layer.

Via the emission side at least 50% or at least 75% of the total radiation decoupled from the semiconductor layer sequence is decoupled during normal operation of the semiconductor chip, for example. The emission side, for example, runs essentially parallel to a main plane of extension of the semiconductor layer sequence.

The emission fields are areas, in particular simply-connected areas, of the emission side through which radiation is emitted from the semiconductor layer sequence during operation. In particular, during operation of an emission field, radiation is emitted over the entire area of the emission field. The emission fields can be controlled individually and independently of each other. For this purpose, an individually and independently energizable contact element can be assigned to each emission field, for example, at a rear side of the semiconductor layer sequence opposite the emission side. Radiation is emitted via a controlled emission field. The emission side, for example, is flat within the manufacturing tolerance.

For example, the semiconductor chip has at least 16 or at least 100 or at least 1000 or at least 1500 such emission fields. For example, each emission field has an area of at least 10 µm² or at least 100 µm² or at least 1000 µm². Alternatively or additionally, the area of each emission field is at most 100000 µm² or at most 50000 µm² or at most 25000 µm².

According to at least one embodiment, the semiconductor chip comprises partition walls, in particular reflecting or absorbing partition walls, on the emission side in the region between two adjacent emission fields. For example, in a plan view of the emission side, the partition walls surround the emission fields at least partially, in particular completely. Preferably, partition walls are arranged between all adjacent emission fields.

The partition walls are preferably attached to the emission side without any additional connecting means, such as adhesive. The distance between the partition walls and the semiconductor material of the semiconductor layer sequence, for example, is at most 1 µm or at most 500 nm.

The partition walls preferably provide an optical separation between a controlled emission field and an adjacent emission field. In other words, for an observer at usual distances of ≥10 cm from the semiconductor chip, two directly adjacent emission fields are sharply separated from each other. A controlled emission field therefore does not outshine a directly adjacent, non-controlled emission field or does not do so noticeably for the observer. Crosstalk between adjacent emission fields is thus reduced by the partition walls.

Particularly preferably, the partition walls are part of a grid, in particular a contiguous grid, with meshes arranged next to each other, for example in a matrix-like manner, wherein the partition walls form a grid with meshes and wherein, in plan view of the main side of each of the emission fields, they are uniquely located in one mesh of the grid. In particular, in plan view of the main side, one or more of the emission fields are then completely surrounded by a contiguous and uninterrupted rail of partition walls.

For example, the partition walls are made of a material different from the semiconductor material of the semiconductor layer sequence. In particular, the partition walls are not integrally formed with the semiconductor layer sequence. The partition walls may be reflective or diffusely scattering or absorbing for the radiation emitted by the semiconductor chip or the semiconductor layer sequence. In particular, the partition walls are opaque to the radiation emitted by the semiconductor chip or the semiconductor layer sequence in the direction parallel and/or perpendicular to the emission side. The partition walls have, for example, a reflectance or absorption coefficient for this radiation of at least 30% or at least 50% or at least 80% or at least 90% or at least 95%. The material of the partition walls may, for example, be an epoxide or silicone provided with reflecting particles, such as titanium dioxide particles, in short $TiO_2$, and/or metal particles, such as silver or aluminium or gold, and/or barium titanium oxide particles, such as $BaTiO_3$, and/or yttrium boron oxide particles, such as $YBO_3$, and/or alkaline earth metal carbon oxide particles, such as $CaCO_3$ or $MgCO_3$, and/or ZnS and/or ZnO and/or $ZrO_2$ and/or $BaSO_4$. The partition walls may further comprise or consist of one or more of the following materials: Ni, Al, Au, Si, Cu.

The partition walls may, for example, have a height measured perpendicular to the main side of, for example, at least 10 µm or at least 30 µm or at least 50 µm. Alternatively or additionally, the height of the partition walls can be ≤150 µm or ≤100 µm or ≤80 µm. For example, the maximum width of the partition walls parallel to the emission side is at most 50 µm or at most 20 µm or at most 10 µm. Alternatively or additionally, the maximum width can be ≥1 µm or ≥5 µm≥10 µm.

According to at least one embodiment, the optoelectronic semiconductor chip comprises a conversion element on one or more emission fields. For example, a conversion element is applied to at least every second emission field or to every emission field. The conversion element is configured to partially or completely convert the electromagnetic radiation emerging from the emission fields during normal operation.

Some or all emission fields can each be uniquely assigned their own conversion element. Alternatively, some or all emission fields may have a common conversion element assigned to them.

The characteristics of a conversion element are described below. If the semiconductor chip comprises several conversion elements, several or all conversion elements can have these characteristics.

The conversion element is preferably formed in one piece. This means that all regions of the conversion element are formed integrally with each other. In particular, the conversion element is formed contiguously, preferably in a simply-connected manner.

If the semiconductor chip comprises several conversion elements, these are preferably not connected. In this case, the partition walls can limit and separate the conversion elements in a lateral direction.

For example, the conversion element covers the associated emission field(s) to least 80% or 90% or completely. For example, a distance between the conversion element and the semiconductor material of the semiconductor layer sequence is not more than 1 µm or not more than 500 nm.

The conversion element preferably comprises two main sides running essentially parallel to the main plane of extension of the semiconductor layer sequence.

The conversion element preferably adjoins the partition walls in lateral direction. This means that the partition walls comprise lateral surfaces running transversely or perpendicularly to the emission side, which are in contact with surfaces of the conversion element running transversely or perpendicularly to the emission side. The lateral direction is a direction parallel to the emission side or the main plane of extension of the semiconductor layer sequence. The conversion element preferably lies form-fittingly against the partition walls. For example, the conversion element partially or completely fills one or more meshes in the grid of partition walls.

According to at least one embodiment, the conversion element comprises a matrix material with first phosphor particles incorporated therein. The first phosphor particles are embedded in and enclosed by the matrix material.

The matrix material is preferably a material which is transparent to the radiation emitted by the semiconductor layer sequence. The matrix material is preferably an organic material. The matrix material is, for example, a siloxane, like silicone, especially transparent silicone.

The first phosphor particles are configured for the conversion of the radiation emitted from the semiconductor layer sequence. For example, the first phosphor particles are particles of an inorganic or organic phosphor. Particles are microscopically small solid bodies which are not directly connected to each other by covalent or ionic or metallic bonds. For example, a particle has an extension of no more than 30 µm or no more than 20 µm in any direction in space.

According to at least one embodiment, the first phosphor particles are sedimented in the matrix material in such a way that the mass fraction of the first phosphor particles is greater in a lower region of the conversion element facing the semiconductor layer sequence than in the remaining region of the conversion element.

The lower region has, for example, a thickness, measured perpendicular to the emission side, of 50% or 34% or 25% or 10% of the total thickness of the conversion element. The lower region extends over the lateral extent of the conversion element. The lower region is in particular the region closest to the semiconductor layer sequence. This means that the lower region comprises an outer surface or outer side of the conversion element facing the semiconductor layer sequence.

The remaining region is the region of the conversion element which does not belong to the lower region. For example, the remaining region of the conversion element also extends over the lateral extent of the conversion element and has a thickness of 50% or 66% or 75% or 90% of the total thickness of the conversion element.

The total thickness of the conversion element is, for example, between 5 µm and 150 µm inclusive, preferably between 20 µm and 150 µm inclusive, especially preferably between 40 µm and 100 µm inclusive. Different conversion elements can have different thicknesses.

The thickness of the conversion element(s) is preferably at most as large as the height of the partition walls. Especially the thickness of the lower part is preferably smaller than the height of the partition walls. In the direction away from the emission side, the partition walls preferably project beyond the lower region of the conversion element located in the region of an emission field.

In the lower region, the first phosphor particles are preferably homogeneously distributed. The mass fraction of the first phosphor particles in the remaining region of the conversion element is, for example, at most 85% or at most 80% or at most 75% or at most 70% or at most 60% or at most 50% of the mass fraction of the first phosphor particles in the lower region of the conversion element. For example, the mass fraction of the first phosphor particles in the lower region is at least 65% or at least 70% or at least 75%. In the remaining region of the conversion element, for example, the mass fraction is at most 60% or at most 50% or at most 40% or at most 30%. The indication of a mass fraction in one region refers to the mass fraction integrated over the entire region.

For example, the mass fraction of the matrix material in the conversion element is at least 20% or at least 30%. For example, the mass fraction of the first phosphor particles in the entire conversion element is between 30% and 75% inclusive.

In at least one embodiment, the optoelectronic semiconductor chip comprises a semiconductor layer sequence with an emission side, the emission side comprising a plurality of emission fields. The semiconductor chip comprises partition walls on the emission side in the region between two adjacent emission fields. The semiconductor chip further comprises a conversion element on one or more emission fields. The conversion element comprises a matrix material with first phosphor particles incorporated therein. The first phosphor particles are sedimented in the matrix material in such a way that the mass fraction of the first phosphor particles in a lower region of a conversion element facing the semiconductor layer sequence is greater than in the remaining region of the conversion element.

Embodiments are based, inter alia, on the realization that the color homogeneity of a pixel of a semiconductor chip is often unsatisfactory. Furthermore, it may be desirable to convert pixels of a semiconductor layer sequence differently. By using partition walls, in particular reflecting or absorbing partition walls, on the one hand the optical separation of different pixels can be improved, on the other hand the partition walls allow to equip different emission fields with different conversion elements or to fill them up with different conversion materials. The sedimentation of the phosphor particles within the matrix material results in a thin, compressed, uniform layer near the emission side. Such a layer is homogeneous, which leads to a high color homogeneity of the corresponding pixel.

According to at least one embodiment, the mass fraction of the first phosphor particles in an upper region of the conversion element facing away from the semiconductor layer sequence is at most 80% or at most 75% or at most 70% or at most 60% or at most 50% of the mass fraction of the first phosphor particles in the lower region of the conversion element.

The upper region has a thickness, measured perpendicular to the emission side, of 50% or 34% or 25% or 10% of the total thickness of the conversion element. The upper regions extends over the lateral extent of the associated conversion element. The upper region is the region furthest away from the emission side. That is, the upper region comprises an outer surface or outer side of the conversion element facing away from the semiconductor layer sequence.

For example, the mass fraction of the first phosphor particles in the upper region of the conversion element is not more than 60% or not more than 55% or not more than 50% or not more than 40% or not more than 30%.

The regions of the conversion element specified herein are preferably simply-connected areas or regions of the conversion element.

According to at least one embodiment, the conversion element comprises scattering particles embedded in the matrix material. The scattering particles serve to scatter the radiation coming from the semiconductor layer sequence or the radiation converted by phosphor particles. For example, the mass fraction of scattering particles in the lower region of the conversion element is at most 80% or at most 70% or at most 50% or at most 1% of the mass fraction of scattering particles in the remaining region and/or in the upper region of the conversion element.

The scattering particles comprise or consist of, for example, one of the following materials: $Al_2O_3$, $SiO_2$, $TiO_2$. However, the scattering particles may also be particles that have been added to the matrix material anyway to adjust the viscosity, such as LPS5547-S1.

According to at least one embodiment, the first phosphor particles comprise or consist of an inorganic phosphor. The phosphor can be a nitride-based phosphor. For example, the phosphor comprises or consists of an alkaline earth silicon nitride or an alkaline earth aluminium silicon nitride. For example, the alkaline earth metal is barium or calcium or strontium. For conversion, the phosphor can be doped with a rare earth ion, such as $Eu^{2}+$, as an activator. The phosphor can also be a garnet-based phosphor. For example, the phosphor has or consists of a rare earth-doped garnet, such as yttrium aluminium garnet, YAG for short, or luthetium aluminium garnet, LuAG for short, or luthetiumyttrium aluminium garnet, LuYAG for short. For conversion, the phosphor can be doped with an activator, for example, with a rare earth element such as cerium.

According to at least one embodiment, some or all emission fields are uniquely assigned their own conversion element.

According to at least one embodiment, the partition walls project beyond the conversion elements in the direction away from the semiconductor layer sequence or terminate flush with the conversion elements. For example, the partition walls project beyond the conversion elements by at least 1 μm or at least 5 μm or at least 10 μm. Alternatively or additionally, the partition walls project beyond the conversion elements by at most 50 μm or at most 20 μm or at most 10 μm.

According to at least one embodiment, a contiguous conversion element covers several emission fields. For example, the conversion element is drawn over the partition walls on a side of the partition walls opposite the semiconductor layer sequence.

According to at least one embodiment, the conversion element comprises second phosphor particles which comprise or consist of a different phosphor than the first phosphor particles. The second phosphor particles may, for example, comprise one of the above-mentioned phosphors.

For example, the semiconductor chip comprises several conversion elements, wherein first conversion elements comprise only first phosphor particles and second conversion elements comprise first and second phosphor particles.

According to at least one embodiment, the mass fraction of the second phosphor particles in the lower region of the conversion element is smaller than in the remaining region of the conversion element. For example, the mass fraction of the second phosphor particles in the lower region is at most 90% or at most 80% or at most 75% or at most 60% or at most 50% of the mass fraction of the second phosphor particles in the remaining region. For example, the mass fraction of the second phosphor particles in the conversion element is between 30% and 70% inclusive.

According to at least one embodiment, the second phosphor particles comprise or consist of an organic phosphor.

According to at least one embodiment, the second phosphor particles are quantum dots. The maximum extension of the quantum dots in one direction is, for example, at most 100 nm or at most 50 nm or at most 30 nm or at most 20 nm or at most 10 nm. The quantum dots include, for example, a semiconductor material such as InGaAs or CdSe or GaInP or InP.

According to at least one embodiment, the second phosphor particles have a lower density and/or a smaller average particle size than the first phosphor particles. For example, the density of the first phosphor particles is at least 120% or at least 130% or at least 150% of the density of the second phosphor particles. Alternatively or additionally, the average volume of the first phosphor particles is at least twice or at least ten times or at least a hundred times the average volume of the second phosphor particles.

By using different sizes and/or densities, it is possible to achieve that the first and second phosphor particles sediment to different degrees within the conversion element. In this way, the first phosphor particles and the second phosphor particles can be separated.

According to at least one embodiment, several different conversion elements with different conversion properties are used on the semiconductor layer sequence or on the emission side. For example, the semiconductor chip comprises first conversion elements which convert the radiation emitted by the semiconductor layer sequence into cold white light, and second conversion elements which convert the radiation emitted by the semiconductor layer sequence into warm white light. For example, the first conversion elements and the second conversion elements are alternately arranged side by side. The first conversion elements and the second conversion elements can be arranged in a checkerboard pattern, for example.

An optoelectronic semiconductor chip described herein can be used, for example, in headlights for motor vehicles.

In addition, a method of manufacturing an optoelectronic component, such as an optoelectronic semiconductor chip, is also specified. The method is particularly suitable for producing an optoelectronic semiconductor chip as described above. This means that all features disclosed in connection with the optoelectronic semiconductor chip are also disclosed for the method and vice versa.

According to at least one embodiment, the method comprises a step A) in which an optoelectronic base element is provided. The optoelectronic base element comprises an emission side. The emission side comprises a plurality of emission fields.

The base element is an optoelectronic element which is set up to generate electromagnetic radiation during normal operation and to emit it via the emission side. For example, at least 50% or at least 75% of the total radiation decoupled from the base element during normal operation of the base element is decoupled via the emission side. For example, the emission side runs essentially parallel to a main plane of extension of the base element.

The characteristics of the emission side and the emission fields described in connection with the optoelectronic semiconductor chip, in particular their geometric configurations, may also apply to the component and vice versa. In particular, the emission fields can be controlled individually and independently of each other.

The emission side is preferably designed flat within the manufacturing tolerance. For example, elevations or depressions on the emission side then have heights and depths of no more than 2 µm or no more than 1 µm.

For example, the emission side of the base element comprises at least two or at least four emission fields. For example, the area of an emission field of the base element is at most 250000 µm$^2$ or at most 200000 µm$^2$.

According to at least one embodiment, the method comprises a step B) in which a plurality of partition walls are formed on the emission side. The partition walls form at least one mesh which, viewed in plan view of the emission side, surrounds an emission field, in particular exactly one emission field, and in so doing runs at least in part between two adjacent emission fields. In other words, the partition walls form a frame which, when viewed in plan view on the emission side, surrounds an emission field, in particular exactly one emission field. "At least in part" means in particular that at least one partition wall of the mesh runs between two adjacent emission fields.

The features of the partition walls described in connection with the optoelectronic semiconductor chip may also apply to the partition walls of the component and vice versa. In particular, the partition walls form a grid as described above, which comprises a plurality of meshes. An emission field can be uniquely assigned to each mesh. The partition walls may be reflective or absorptive for radiation from the base element or component, for example with the reflectance or absorbance mentioned above.

The partition walls created in step B) are preferably all connected. Particularly preferably, the partition walls are formed in one piece with each other.

According to at least one embodiment, the method comprises a step C) in which a region surrounded by the mesh of partition walls is filled with a liquid or viscous filling material. If several meshes are formed by the partition walls, preferably several or all regions surrounded by meshes are filled with a liquid or viscous filling material.

The filling material can be a transparent material, like clear silicone, or a conversion material. A conversion material preferably comprises a matrix material with distributed first phosphor particles.

For example, the filling material can be applied by jetting or dispensing or spraying or squeegee. A mask or stencil can be used as an aid. The partition walls are preferably designed to enclose the liquid filler material and prevent the liquid filler material from flowing off in a lateral direction. In other words, the partition walls form barriers for the liquid filling material.

In this case, "filling" can mean that the filling material is filled up to the height of the partition walls at most.

According to at least one embodiment, the method comprises a step E) in which the filling material is cured to at least one filling element, such as a conversion element. The filling element then covers an emission field, in particular exactly one emission field. If several regions surrounded by meshes are filled with filling material, preferably several filling elements are formed, each of which is uniquely assigned to an emission field, for example. The resulting filling elements are preferably separated and spaced from each other.

According to at least one embodiment, steps A), B), C) and E) are carried out in the specified order and one after the other.

The partition walls applied in step B) can be temporary partition walls or final partition walls. Temporary partition walls are removed in particular after the filling material has cured and are replaced, for example, by final partition walls. Final partition walls remain in the optoelectronic component. All the information given up to now and in the following concerning partition walls, in particular their geometric configurations, may apply to temporary and final partition walls.

According to at least one embodiment, the optoelectronic base element is a semiconductor layer sequence. The semiconductor layer sequence is provided, for example, in a wafer compound. In plan view, different emission fields then preferably overlap with different regions of the semiconductor layer sequence. The semiconductor layer sequence is, for example, contiguous or comprises several separate regions that were originally connected.

According to at least one embodiment, the optoelectronic base element is separated after step E), so that individual optoelectronic components are created. Each optoelectronic component then preferably comprises a section of the emission side with exactly one or more emission fields and exactly one or more filling elements, which, viewed in plan view, is completely surrounded by the partition walls.

According to at least one embodiment, the method comprises a step D) in which the first phosphor particles sediment or are sedimented in the matrix material so that the mass fraction of the first phosphor particles is greater in a lower region of the conversion material facing the semiconductor layer sequence than in the remaining region of the conversion material.

According to at least one embodiment, steps A) to E) are carried out in the specified order and successively.

According to at least one embodiment, the conversion material is centrifuged in step D) to accelerate the sedimentation. For example, the semiconductor layer sequence with the conversion material on top is placed in a centrifuge and then centrifuged.

According to at least one embodiment, the partition walls are formed reflective or absorbent in step B). For example, the partition walls appear white or black to a user.

According to at least one embodiment, a structured mask, for example, a mask made of photoresist or a dielectric, is used for the application of the partition walls in step B). The mask is produced, for example, by means of a lithography process or by means of laser direct imaging, or LDI for short. The mask is designed in such a way that there are trenches in the region where the partition walls are to be created. Within the trenches, the partition walls are then created.

According to at least one embodiment, the partition walls are formed from a photoresist in step B). The partition walls of the photoresist then form a photoresist mask. The partition walls of the photoresist are produced, for example, by a lithography process or direct laser imaging. For this purpose, for example, a photoresist layer can be applied to the emission side, e.g. sprayed on or applied as a film. The photoresist layer can then be developed using a mask and exposure. It is also conceivable that the photoresist layer is exposed and developed by means of direct laser imaging without an additional mask. With direct laser imaging, particularly precise structures can be produced from the photoresist layer. It is advantageous to have an automated, optical detection of the position of the emission fields before the laser direct imaging. This avoids displacement of the filling elements with respect to the emission fields. This would have a negative effect on the color homogeneity.

The partition walls of the photoresist can also be absorbing or reflecting.

According to at least one embodiment, the partition walls of the photoresist are removed after step C). This means that, in step B), the partition walls of the photoresist are temporary partition walls.

According to at least one embodiment, after step C), final partition walls are arranged in the region where the partition walls of the photoresist were previously formed. The final partition walls can be reflective or absorbent.

According to at least one embodiment, after step E) or already after step D), the partition walls and/or the filling element are ground. For example, protruding regions of the partition walls and/or the filling element are ground in such a way that the partition walls and the filling element terminate flush with each other after the grinding process.

According to at least one embodiment, the partition walls are galvanically grown in step B). The partition walls then preferably comprise or consist of a metal, such as copper or aluminium or nickel. In particular, such partition walls are final partition walls.

To form the partition walls, for example, an electrically conductive layer is first deposited on the emission side, for example by sputtering. The electrically conductive layer is preferably metallic. For example, the electrically conductive layer has a thickness between 100 nm and 500 nm inclusive. The electrically conductive layer, for example, is simply-connected and covers a plurality of the emission fields.

Subsequently, for example, an electrically insulating layer is applied to the electrically conductive layer. The electrically insulating layer is then preferably structured, for example by LDI. The electrically insulating layer is preferably removed where the partition walls are to be created. In the regions where the partition walls are to be created, the electrically conductive layer is exposed again. In contrast, the electrically insulating layer preferably remains on the emission side in the region of the emission fields and covers these regions completely, for example.

The partition walls can then be grown galvanically using an electrophoresis process in the region of the exposed electrically conductive layer.

After the galvanic growth of the partition walls, the electrically insulating layer can be removed also from the remaining regions. The electrically conductive layer can be removed from the emission fields, for example by etching.

The galvanically grown partition walls can simultaneously serve or be configured for the electrical contacting of the optoelectronic base element or the optoelectronic component.

An optoelectronic component is also specified. The optoelectronic component can be manufactured in particular by the method described herein. All features disclosed in connection with the method are therefore also disclosed for the optoelectronic component and vice versa. The optoelectronic component may, for example, be the optoelectronic semiconductor chip described above. Therefore all features disclosed in connection with the optoelectronic semiconductor chip are also disclosed for the optoelectronic component and vice versa.

According to at least one embodiment, the optoelectronic component comprises an optoelectronic base element with an emission side that is flat within the manufacturing tolerance. The emission side comprises exactly one or more emission fields.

According to at least one embodiment, the optoelectronic component comprises several partition walls on the emission side, wherein the partition walls surround the emission field when viewed in plan view of the emission side. For example, the partition walls form meshes of a grid, where each mesh is uniquely assigned to an emission field. In plan view of the emission side, partition walls can run between adjacent emission fields.

According to at least one embodiment, the optoelectronic component comprises a filling element which, viewed in plan view of the emission side, is surrounded by the partition walls and rests form-fittingly against the partition walls. The filling element can be limited laterally by the partition walls. The filling element can be a transparent or translucent element for the electromagnetic radiation of the base element. The filling element can also be a conversion element, for example, a conversion element as described above.

According to at least one embodiment, the partition walls are not formed integrally with the optoelectronic base element or are not formed integrally with the emission side. This means that the partition walls are elements of the component different from the base element. In particular, an interface is formed between the partition walls and the emission side, which indicates that the partition walls were applied to the emission side after completion of the flat emission side.

According to at least one embodiment, when viewed in plan view of the emission side, the filling element overlaps with the emission field surrounded by the partition walls. In particular, when viewed in plan view of the emission side, the filling element completely covers the emission field. Preferably, the filling element only overlaps with a single emission field.

The component may comprise several filling elements, each of which is preferably uniquely assigned to an emission field and only overlaps with this emission field. Each filling element is preferably surrounded by a specially assigned mesh of partition walls when viewed from above.

Emission fields can also be covered by the partition walls, for example, completely covered. In this case the partition walls are preferably transparent for the radiation from the emission fields. This can be realized especially if the partition walls are made of photoresist.

The partition walls surrounding the filling element can protrude beyond the filling element in a direction away from the base element or can terminate flush with the filling element.

According to at least one embodiment, an area of the region of the emission side covered by the filling element is at most 50% or at most 25% or at most 10% or at most 5% larger than the area of the emission field covered by the filling element.

All information given up to now and in the following for a filling element may apply to several or all filling elements.

According to at least one embodiment, the optoelectronic base element comprises a semiconductor chip arranged on a carrier and a potting around the semiconductor chip.

The semiconductor chip is preferably designed as a thin film semiconductor chip or as a surface emitter. The semiconductor chip comprises, for example, a semiconductor layer sequence, for example, a semiconductor layer sequence as described above. The semiconductor chip preferably comprises a contiguous active layer. For example, the lateral extent of the semiconductor chip is at most 1% or at most 5% larger than the lateral extent of the active layer of the semiconductor chip.

The potting around the semiconductor chip can be a plastic or an epoxy or silicone. The potting is preferably reflective or absorptive for radiation emitted by the semiconductor chip. For example, the reflectance or absorption coefficient for this radiation is at least 90%. The potting may appear white or black to a user. The potting surrounds the semiconductor chip preferably completely, when viewed in plan view of the emission side. The encapsulation rest form-fittingly against the semiconductor chip.

The carrier can be a ceramic carrier, for example. Between the carrier and the semiconductor chip, a conductor track can be arranged for electrical contacting of the semiconductor chip.

According to at least one embodiment, the semiconductor chip comprises a radiation exit side. Via the radiation exit side, the semiconductor chip emits, for example, at least 50% or at least 75% or at least 90% of the radiation emitted by the semiconductor chip in its intended operation. The radiation exit side can have a rectangular basic shape. In a corner region, the radiation exit side may have a recess for electrical contacting of the semiconductor chip. The radiation exit side is facing away from the carrier.

The semiconductor chip is preferably not segmented or pixelated. Preferably, the semiconductor chip has lateral expansions, measured parallel to the emission side, of at most 500 µm or at most 400 µm.

According to at least one embodiment, the radiation exit side of the semiconductor chip together with a side of the potting facing away from the carrier forms at least part of the emission side. In particular, the radiation exit side of the semiconductor chip and the potting terminate flush at the emission side within the manufacturing tolerance. For example, the semiconductor chip is encapsulated with the potting using an injection moulding process such as Film-Assisted-Molding Technology.

According to at least one embodiment, the radiation exit side of the semiconductor chip forms the emission field. In the region next to the radiation exit side of the semiconductor chip, i.e., in the region where the potting is located, the optoelectronic base element preferably does not emit any radiation.

The optoelectronic base element can comprise several semiconductor chips. All the above information on one semiconductor chip may apply to several or all semiconductor chips. In particular, the radiation exit sides of the semiconductor chips each form an emission field of the emission side. In this case, the potting preferably extends between the semiconductor chips. Viewed in plan view of the emission side, the potting may form a grid with meshes, wherein exactly one semiconductor chip is arranged in each mesh. The individual semiconductor chips can be controlled individually and independently of one another, which means that the individual emission fields can be controlled individually and independently of one another.

According to at least one embodiment, the partition walls on the emission side are formed in the region of the potting. This means that, viewed in plan view of the emission side, the partition walls overlap with the potting around the semiconductor chip. Preferably, the partition walls do not overlap with the semiconductor chip when viewed in plan view.

According to at least one embodiment, the partition walls are metallic. The partition walls can be configured in particular for electrical contacting of the semiconductor chip. In this case, each semiconductor chip is preferably assigned a frame of partition walls, wherein the partition walls of the frame are uniquely assigned to the semiconductor chip.

BRIEF DESCRIPTION OF THE DRAWINGS

In the following, an optoelectronic semiconductor chip described herein, a method of manufacturing an optoelectronic component described herein and an optoelectronic component described herein are explained in more detail with reference to drawings on the basis of exemplary embodiments. Same reference signs indicate same elements in the individual figures. However, the size ratios involved are not to scale, individual elements may rather be illustrated with an exaggerated size for a better understanding.

In the figures:

FIGS. 3A to 4A, 6 and 7 show exemplary embodiments of the optoelectronic semiconductor chip;

DETAILED DESCRIPTION OF ILLUSTRATIVE EMBODIMENTS

Figure 1A:
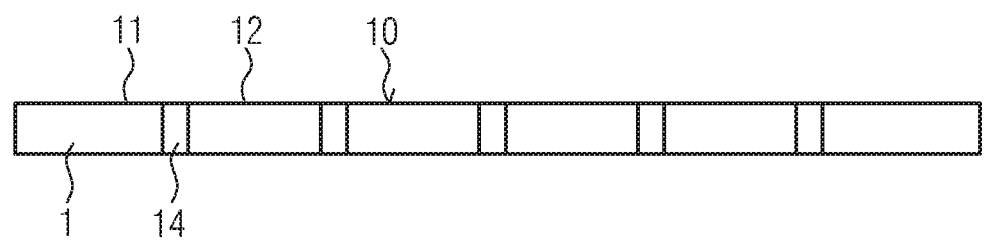
FIGS. 1A to 2C and 5A to 5C show different positions in exemplary embodiments of the method of manufacturing an optoelectronic component.

FIG. 1A shows a first position in an exemplary embodiment of the method. An optoelectronic base element 1 in the form of a semiconductor layer sequence 1, for example, an AlInGaN-based semiconductor layer sequence 1, is provided. The semiconductor layer sequence 1 comprises an emission side 10, through which electromagnetic radiation is coupled out of the semiconductor layer sequence 1 during operation. The emission side 10 is divided into a plurality of emission fields 11, 12. Between the emission fields 11, 12 there are non-luminous regions 14. For example, contact elements are arranged on a rear side of the semiconductor layer sequence 1 opposite the emission side 10, via which the semiconductor layer sequence is energized. The size of the emission fields 11, 12, for example, is essentially defined by the projection of the contact elements on the emission side 10. For example, no contact elements are arranged in the region of the non-luminous regions 14. In the region of the non-luminous regions 14, the semiconductor layer sequence 1 may also have trenches which penetrate an active layer of the semiconductor layer sequence 1.

For example, the emission fields 11, 12 each have a square shape with dimensions of approximately 125 µm×125 µm. The non-luminous regions 14 between the emission fields 11, 12, for example, have a width, measured parallel to the main plane of the semiconductor layer sequence 1, of about 10 µm.

Figure 1B:
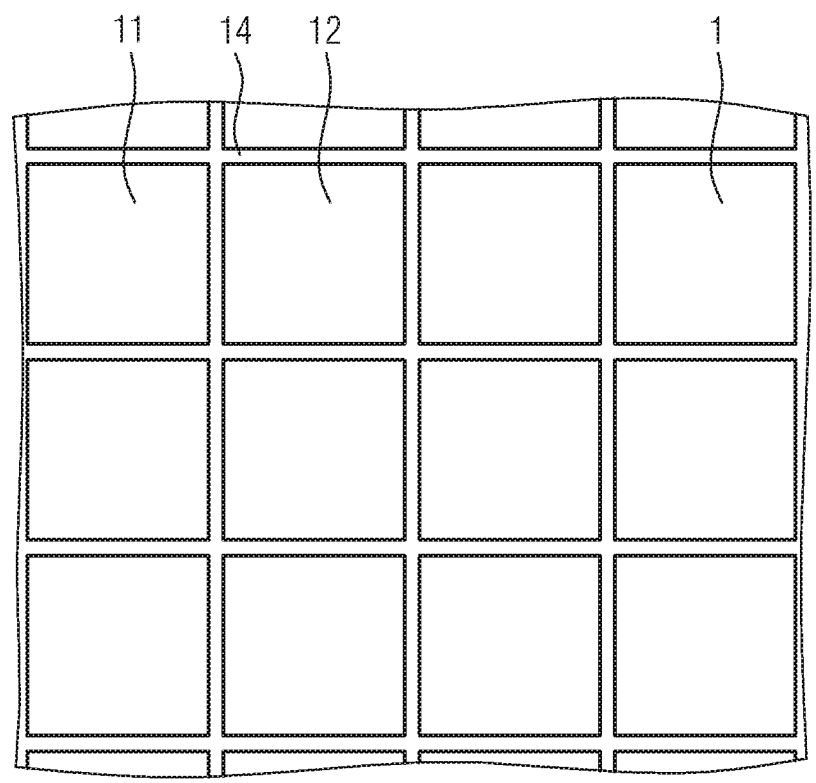

FIG. 1B shows the semiconductor layer sequence 1 in plan view of the emission side 10. The emission fields 11, 12 are square and arranged in a regular matrix pattern. The non-luminous regions 14 form a grid around the emission fields 11, 12, with the emission fields 11, 12 being surrounded by meshes of the grid.

Figure 1C:
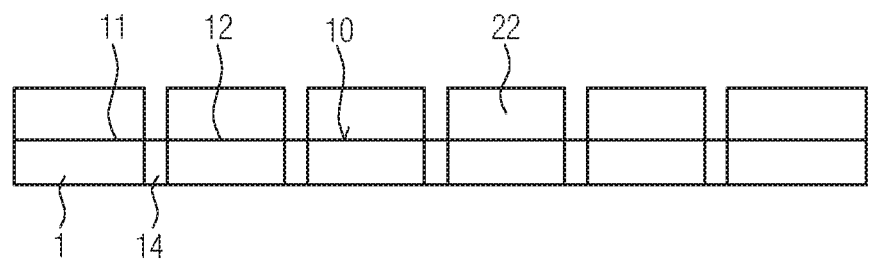

FIG. 1C shows another position in the method. A photoresist mask 22 is applied to the emission side 10. The photoresist mask 22 comprises trenches in the region of the non-luminous regions 14. The emission fields 11, 12 are completely covered by the photoresist material of the photoresist mask 22. The photoresist mask 22 is produced by means of a lithography process or direct laser imaging, for example.

Figure 1D:
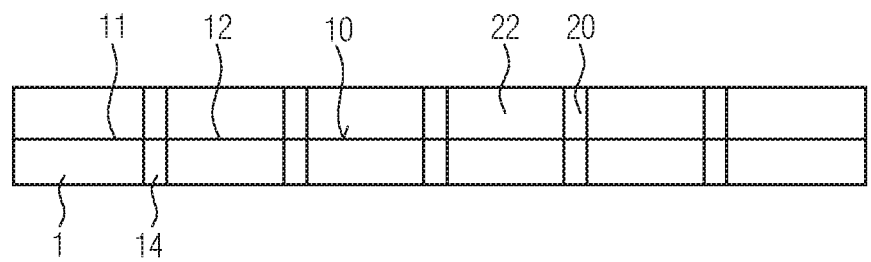

FIG. 1D shows a subsequent position in the method in which reflective partition walls 20 are formed in the trenches of photoresist mask 22. The reflective partition walls 20 comprise, for example, silicone with $TiO_2$ particles embedded therein. The material of the reflective partition walls 20 may be applied by jetting or dispensing or spraying or squeegee.

Figure 1E:
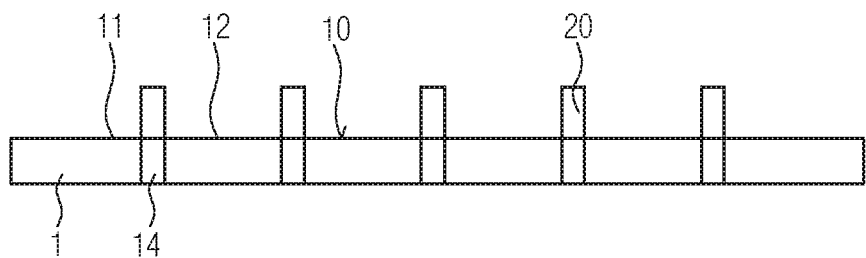

In the position shown in FIG. 1E, the reflective partition walls 20 are cured and the photoresist mask 22 is removed. This exposes the emission fields 11, 12 of the emission side 10.

Figure 1F:
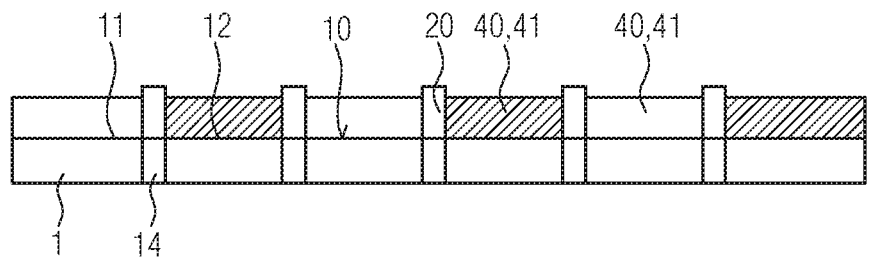

FIG. 1F shows a position of the method in which a conversion material 40, 41 is applied to the emission fields 11, 12 in the region between the reflective partition walls 20. For example, the conversion material 40, 41 is applied in a liquid or viscous state by means of jetting or dispensing. The conversion material 42, 41 comprises a matrix material 40, e.g. silicone, in which first phosphor particles 41 are distributed.

In this case, different conversion materials 40, 41 are applied to different emission fields 11, 12. In particular, the emission side 10 is divided into first ii and second 12 emission fields. The first ii and second 12 emission fields are arranged alternately next to each other on emission side 10. A first conversion material 40, 41 is applied to the first emission fields 11 and a second conversion material 40, 41 is applied to the second emission fields 12. The conversion materials 40, 41 on the different emission fields 11, 12 differ, for example, with regard to the first phosphor particles 41. For example, the conversion materials 40, 41 on the first ii and second 12 emission fields 11 are selected so that during operation of the finalized semiconductor chip cold white light is emitted in the region of the first emission fields 11 and warm white light is emitted in the region of the second emission fields 12. The resulting optoelectronic semiconductor chip then comprises warm white and cold white pixels.

The first phosphor particles 41 used are, for example, inorganic phosphor particles and can be based on a nitride or a garnet.

Figure 1G:
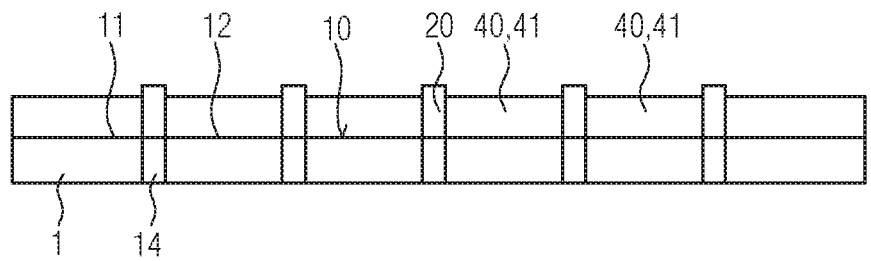

FIG. 1G shows a position in the method where, unlike in FIG. 1F, the same conversion material 40, 41 is applied to all emission fields 11, 12. In this case, the conversion material 40, 41 may be sprayed or squeegeed on, for example.

Figure 1H:
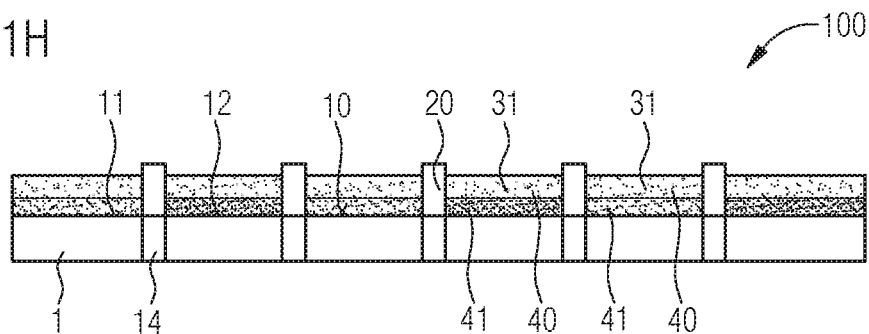

In the position of FIG. 1H, a position is shown in the method where the first phosphor particles 41 are sedimented within the conversion material 40, 41 or within the matrix material 40. The sedimentation process may have been accelerated by centrifugation. Subsequently, the conversion material 40, 41 was cured, resulting in conversion elements 31. By an optional separation process of the semiconductor layer sequence 1, an optoelectronic component 100 in the form of an optoelectronic semiconductor chip 100 was created, which is shown in a cross-sectional view in FIG. 1H.

As a result of the sedimentation, the first phosphor particles 41 have settled within the matrix material 40, so that in a lower region of the conversion elements 31, which in each case in the present case, for example, has a thickness of 50% of the total thickness of the conversion element 31, the mass fraction of the first phosphor particles 41 is greater than in the remaining region of the conversion elements 31. For example, the mass fraction of the first phosphor particles 41 in the remaining region of the conversion element 31 is at most 50% of the mass fraction of the first phosphor particles 41 in the lower region.

Due to the sedimentation process, the first phosphor particles 41 are distributed particularly homogeneously in the lower region, so that particularly color homogeneous pixels are realized with the semiconductor chip 100 shown.

Figure 2A:
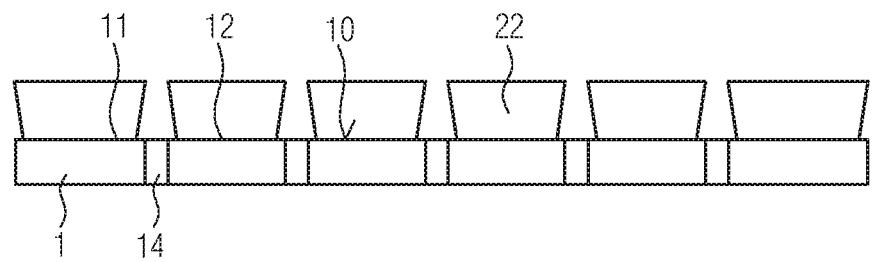
Figure 2B:
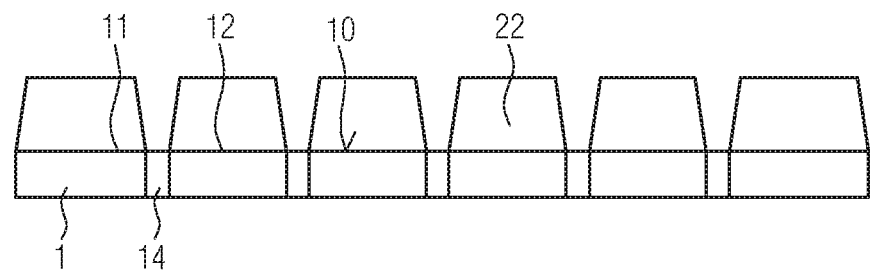
Figure 2C:
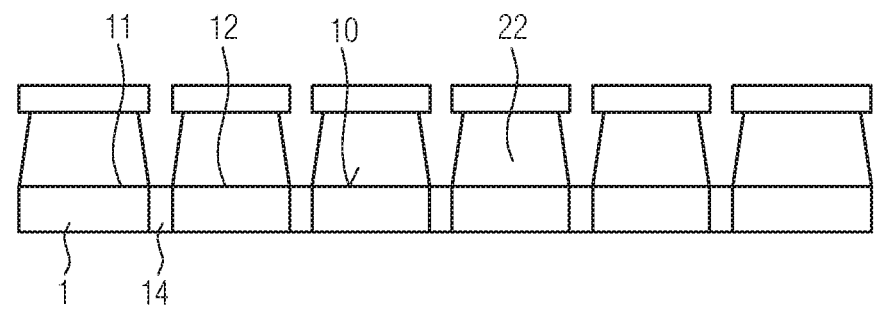

FIGS. 2A to 2C show different positions in exemplary embodiments of the method, in which the photoresist mask 22 is designed differently than in FIG. 1C.

In FIG. 2A, the trenches in the photoresist mask 22 widen towards the emission side 10. With such a photoresist mask 22, partition walls 20 are formed with increasing width towards the emission side 10.

In FIG. 2B, the trenches in the photoresist mask 22 taper towards the emission side 10, so that ultimately partition walls 20 are formed whose width decreases towards the emission side 10.

In FIG. 2C, the trenches in the photoresist mask 22 show an undercut. The resulting partition walls 20 initially widen in the direction away from the emission side 10. After the widening section, there is a step in the partition walls 20 where the width of the partition walls 20 decreases again. This is followed by a section in the partition walls 20, where the width of the partition walls 20 remains essentially constant.

Figure 3A:
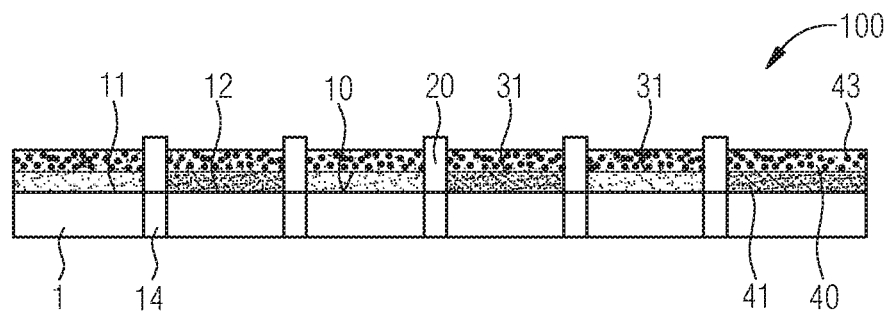

FIG. 3A shows an exemplary embodiment of the optoelectronic semiconductor chip 100, such as can be manufactured using the method described above. The semiconductor chip 100 differs from the semiconductor chip 100 in FIG. 1H only in that additional scattering particles 43 are distributed in the conversion elements 31. The scattering particles 43 are embedded in the matrix material 40 of the conversion elements 31. In this case, a mass fraction of the scattering particles 43 in the remaining region of the conversion elements 31 is greater than in the lower region of the conversion elements 31. The scattering particles 43 may, for example, have lower densities and/or a smaller average particle size than the first phosphor particles 41, so that they sediment less strongly during the sedimentation process than the first phosphor particles 41.

The scattering particles 43 are, for example $Al_2O_3$ particles. Even if such scattering particles 43 are not shown in all exemplary embodiments, they can be used in any of the exemplary embodiments described so far and in the following.

Figure 3B:
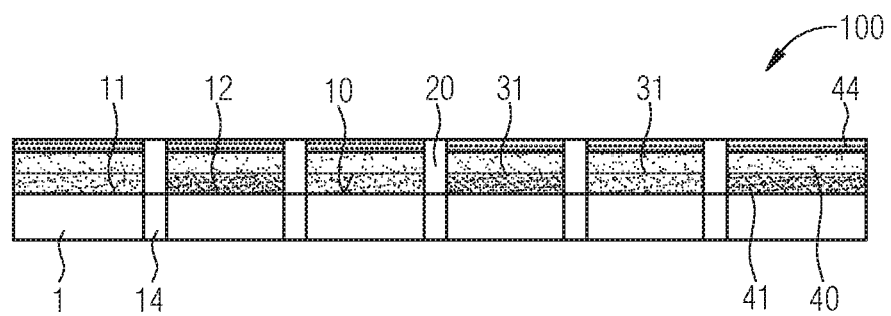

FIG. 3B shows an exemplary embodiment of the optoelectronic semiconductor chip 100, in which a scattering layer 44 is applied to the side of the conversion elements 31 facing away from the semiconductor layer sequence 1. Like the scattering particles 34 in FIG. 3A, the scattering layer 44 serves to scatter and homogenize the emitted radiation. The scattering layer 44 may be sprayed on.

Figure 4A:
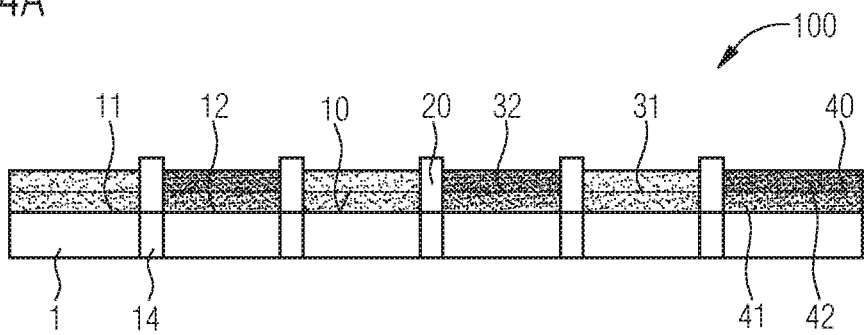

FIG. 4A shows an exemplary embodiment of an optoelectronic semiconductor chip 100 in which conversion elements 31 are arranged on the first emission fields 11, which only contain first, sedimented phosphor particles 41. Conversion elements 32 are formed on the second emission fields 12, which comprise both, first sedimented phosphor particles 41 and second phosphor particles 42. The second phosphor particles 42 are less sedimented or not sedimented at all. For example, the first phosphor particles 41 are inorganic phosphor particles and the second phosphor particles 42 are organic phosphor particles. The mass fraction of the second phosphor particles 42 in the lower region of the conversion elements 32 is smaller than in the remaining region of the conversion elements 32.

Figure 4B:
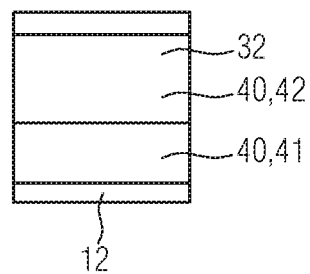
FIGS. 4B and 4C show detailed views of conversion elements of exemplary embodiments of the optoelectronic semiconductor chip.
Figure 4C:
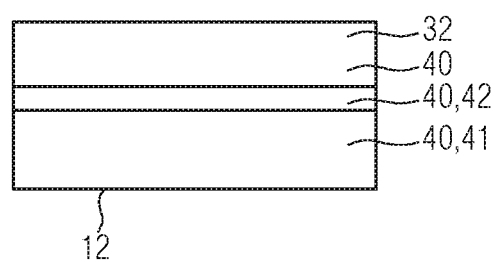

FIGS. 4B and 4C show possible sections of the conversion element 32 of FIG. 4A.

FIG. 4B shows that the lower region with the higher mass fraction of the first phosphor particles 41 is approximately ⅓ of the thickness of the conversion element 32. In the remaining region of the conversion element 32, for example, the mass fraction of the first phosphor particles 41 is only about 70% as great as in the lower region of the conversion element 32. Instead, in the remaining region of the conversion element 32, the mass fraction of the second phosphor particles 42 is greater than in the lower region.

In FIG. 4C, the lower region with the increased mass fraction of first phosphor particles 41 is approximately half the thickness of the conversion element 312. In a central region, the mass fraction of the second phosphor particles 42 is greater than in the remaining region of the conversion element 32. The central region, for example, makes up approximately 10% of the thickness of the conversion element 32. In an upper region of the conversion element 32, which is about ⅓ of the thickness of the conversion element 32, the mass fraction of the first phosphor particles 41 is smaller than in the lower region. Likewise, the mass fraction of the second phosphor particles 42 is smaller in the upper region than in the central region.

Figure 5A:
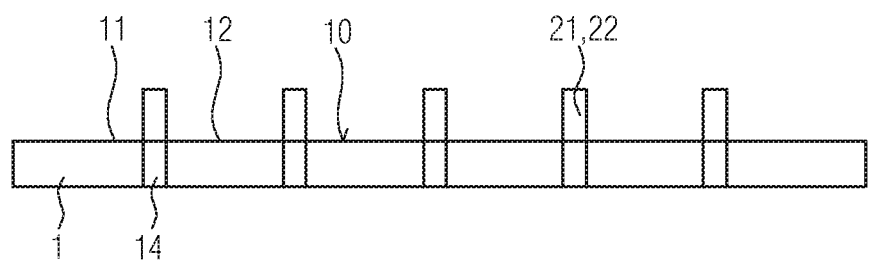
Figure 5B:
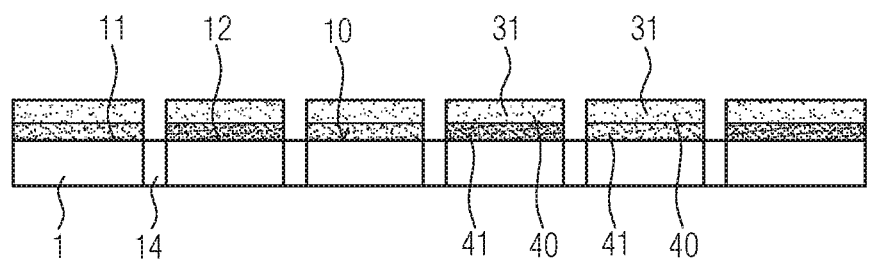
Figure 5C:
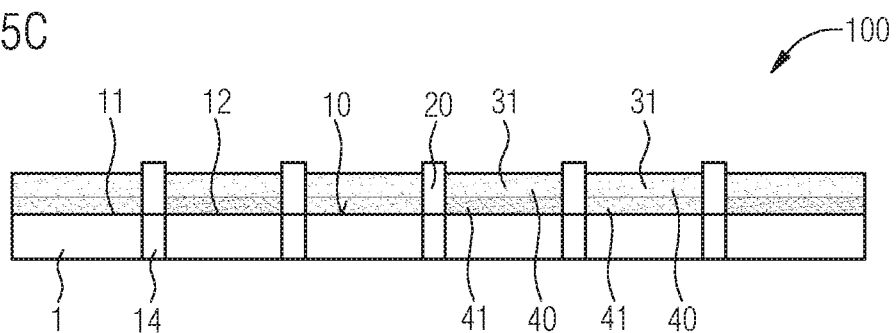

FIGS. 5A to 5C show positions in another exemplary embodiment of the method.

In contrast to FIG. 1, a photoresist mask 22 made of temporary partition walls 21 is first formed (see FIG. 5A). The temporary partition walls 21 thus consist of the photoresist material. The photoresist mask 22 only covers the non-luminous regions 14. On the other hand holes are provided in the photoresist mask 22 in the region of the emission fields 11, 12, so that the emission fields 11, 12 are exposed and not covered by the photoresist mask 22.

In the position shown in FIG. 5B, the holes in the photoresist mask 22 are filled with a conversion material 40, 41. The conversion material 40, 41 is then cured so that a conversion element 31 is formed above each emission field 11, 12. In addition, the temporary partition walls 21 made of the photoresist material have been removed. In the region between adjacent conversion elements 31 and in the places where the temporary partition walls 21 were previously located, trenches have now been formed.

In the position of FIG. 5C, an exemplary embodiment of the optoelectronic semiconductor chip 100 is shown, in which the trenches between the conversion elements 31 are filled with final reflective partition walls 20.

Figure 6:
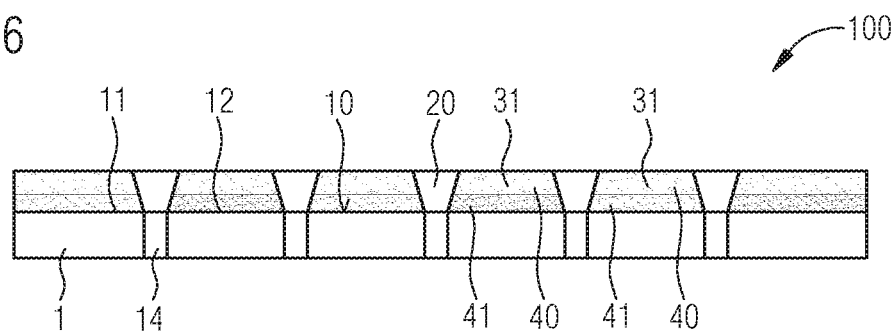

FIG. 6 shows another exemplary embodiment of an optoelectronic semiconductor chip 100. The semiconductor chip 100 differs from the semiconductor chip 100 of FIG. 1H only in the shape of the reflective partition walls 20. In the present case, the reflective partition walls 20 widen in the direction away from the emission side 10. Such reflective partition walls 20 can, for example, be produced with the photoresist mask 22 of FIG. 2B.

Figure 7:
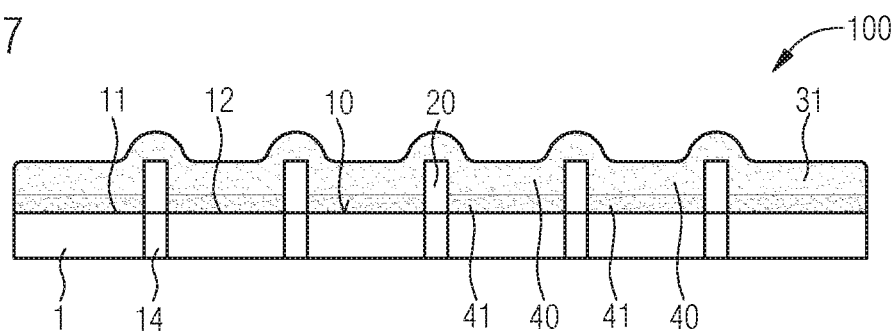

FIG. 7 shows an exemplary embodiment of an optoelectronic semiconductor chip 100 in which a contiguous conversion element 31 covers several emission fields 11, 12. The conversion element 31 is drawn over the partition walls 20. For example, the conversion material 40, 41 is sprayed or squeegeed onto the emission fields 11, 12 and the reflective partition walls 20 so that the conversion material 40, 41 forms over the reflective partition walls 20.

Figure 8A:
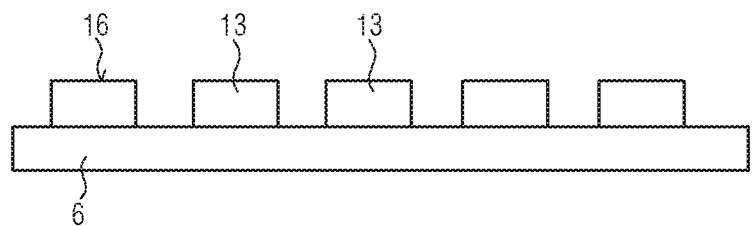
FIGS. 8A to 9H show various positions in further exemplary embodiments of the method of manufacturing an optoelectronic component.

FIG. 8A shows a first position in a further exemplary embodiment of the method of manufacturing an optoelectronic component. Here a carrier 6, for example a ceramic carrier, is provided with semiconductor chips 13 applied to it. The semiconductor chips 13 are preferably thin-film chips and are based on AlInGaN, for example. The sides of the semiconductor chips 13 facing away from the carrier 6 each form a radiation exit side 16, through which a large part of the radiation decoupled from the semiconductor chip 13 is coupled out during intended operation of a semiconductor chip 13. The semiconductor chips 13 are preferably not segmented or pixelated.

Figure 8B:
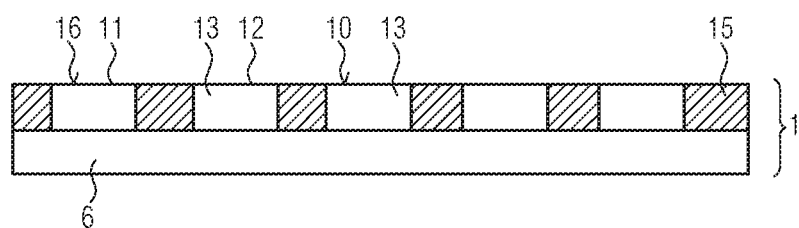

FIG. 8B shows a second position in which a potting 15, in particular a reflective or absorptive potting, for example comprising silicone or epoxy, is arranged between the semiconductor chips 13. The potting 15 is formed between the semiconductor chips 13 by means of an injection moulding process, for example.

The carrier 6, the semiconductor chips 13 and the potting 15 together form an optoelectronic base element 1 with an emission side 10. The radiation exit sides 16 of the semiconductor chips 13 together with the side of the potting 15 facing away from the carrier 6 form this emission side 10. The emission side 10 is flat within the manufacturing tolerance.

The radiation exit sides 16 of the semiconductor chips 13 also form the emission fields 11, 12 or pixels of the emission side 10.

Figure 8C:
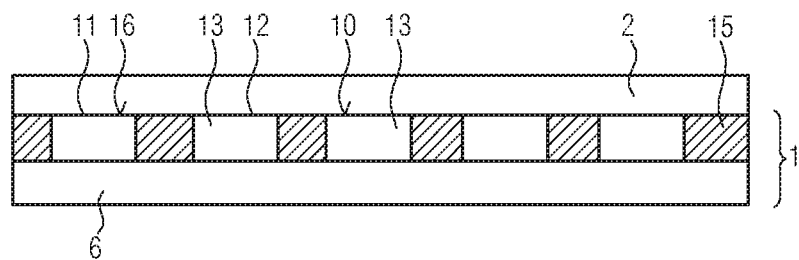

FIG. 8C shows a third position in which a photoresist layer 2 is applied to the emission side 10 of the base element 1.

Figure 8D:
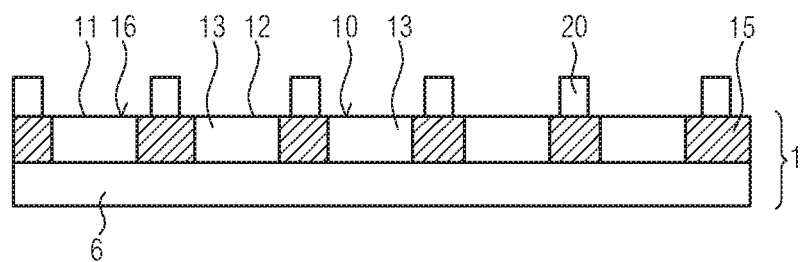

In the position shown in FIG. 8D, the photoresist layer 20 is structured into a plurality of partition walls 20, for example by means of direct laser imaging, or LDI for short. The partition walls 20 are arranged in the region between adjacent semiconductor chips 13, i.e., in the region of the potting 15.

Figure 8E:
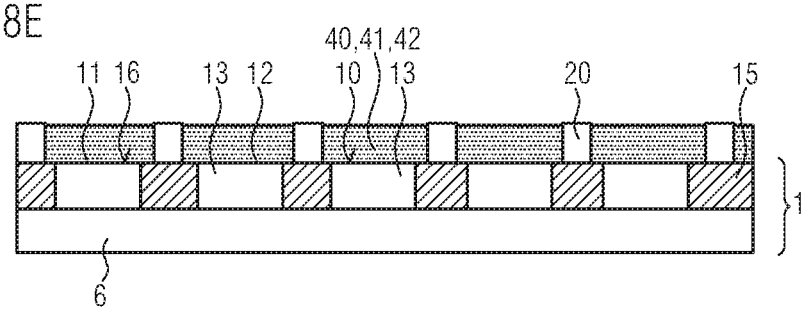

In the position shown in FIG. 8E, a liquid or viscous filling material, in the present case in the form of a conversion material 40, 41, 42, is applied to the emission fields 11, 12. The conversion material 40, 41, 42 is only filled up to such an extent that the conversion material 40, 41, 42 does not flow over the partition walls 20. Thus, in particular, the partition walls 20 protrude above the conversion material 40, 41, 42 in a direction away from support 6.

Figure 8F:
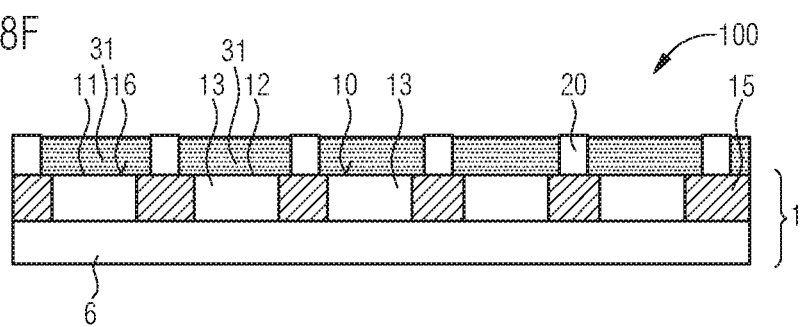

FIG. 8F shows another position of the method in which the conversion material 40, 41, 42 is cured to form filling elements 31 in the form of conversion elements 31. Individual conversion elements 31 are then uniquely assigned to the individual emission fields 11, 12 or the individual semiconductor chips 13. FIG. 8F shows a cross-sectional view of a finalized optoelectronic component 100. However, a separation process, for example with cutting planes through the potting 15, could also be carried out to produce several optoelectronic components 100.

Figure 8G:
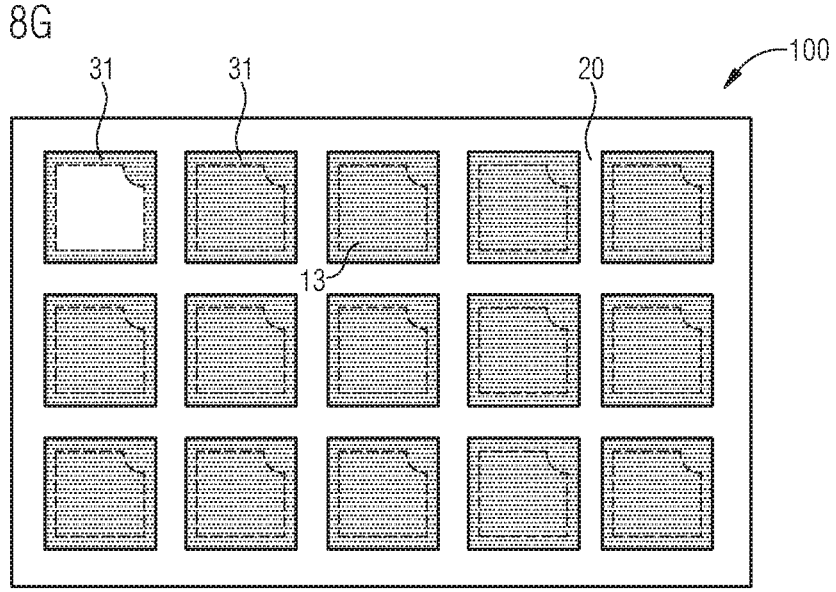

FIG. 8G shows the optoelectronic component 100 of FIG. 8F in plan view of the emission side 10. In particular, it can be seen in this plan view that the partition walls 20 form a grid with a plurality of meshes. Each mesh is uniquely assigned a conversion element 31, so that the mesh surrounds the associated conversion element 31 and the associated semiconductor chip 13. The conversion elements 31 also cover the entire associated semiconductor chip 13 when viewed in plan view.

A sharper optical separation of the individual semiconductor chips 13 can be achieved by the partition walls 20. It is also advantageous that each semiconductor chip 13 is assigned its own filling element 31 or conversion element 31, wherein the conversion elements 31 do not protrude far beyond the assigned semiconductor chip 13. This increases the colour homogeneity.

FIGS. 9A to 9H show a further exemplary embodiment of the method of manufacturing an optoelectronic component.

In the first position shown in FIG. 9A, a carrier 6 is again provided with a plurality of semiconductor chips 13 mounted on it. A conductor track 61 is arranged between the semiconductor chips 13 and the carrier 6. The conductor track 61 is configured for common electrical contacting of the semiconductor chips 13 arranged in a row.

Figure 9A:
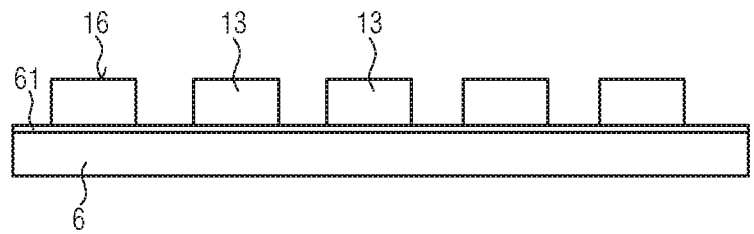
Figure 9B:
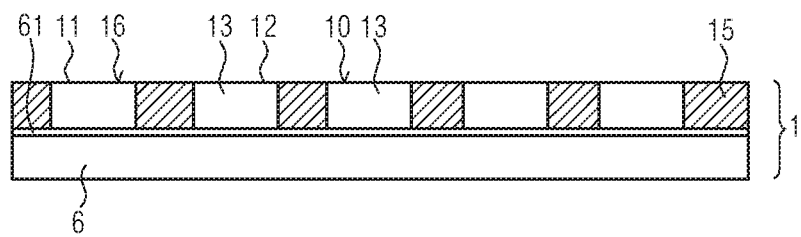

The position of FIG. 9B is essentially the same as of FIG. 8B. Again, a potting 15 is arranged between the semiconductor chips 13 in such a way that a side of the potting 15 facing away from the carrier 6 together with the radiation exit sides 16 of the semiconductor chips 13 forms an essentially flat emission side 10.

Figure 9C:
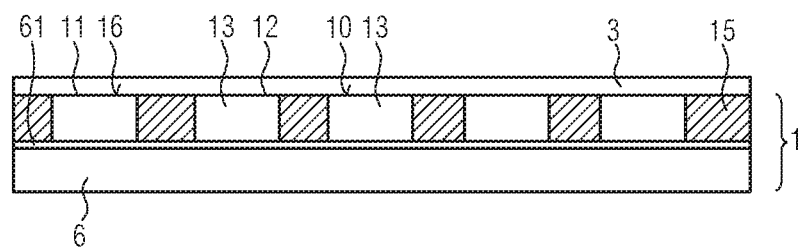

In the position shown in FIG. 9C, an electrically conductive layer 3, for example a metal layer such as a copper layer, is applied to the emission side 10. The electrically conductive layer 3 is sputtered on, for example. A thickness of the electrically conductive layer 3, for example, is between 100 nm and 500 nm inclusive.

Figure 9D:
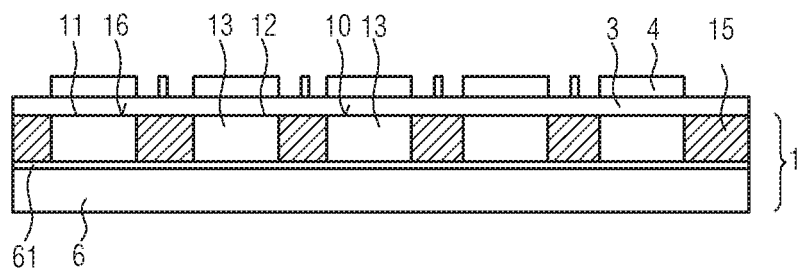

FIG. 9D shows a position in the method where a structured, electrically insulating layer 4 is deposited on top of the electrically conductive layer 3. For this purpose, for example, an electrically insulating layer 4 was first applied over the entire surface of the electrically conductive layer 3 and then structured using a laser.

The electrically insulating layer 4 is structured in such a way that the electrically conductive layer 3 is exposed in regions where partition walls are to be created afterwards. These regions are located between the semiconductor chips 13, where the emission side 10 is formed by the potting 15. In particular, the emission fields 11, 12 are completely covered by the electrically insulating layer 4.

Figure 9E:
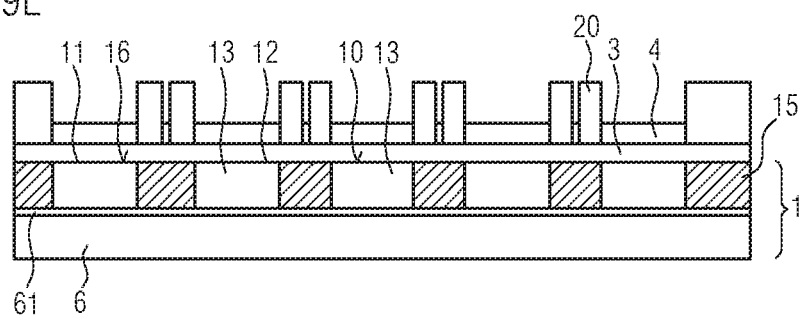

FIG. 9E shows another position in the method in which partition walls 20 have grown galvanically in the exposed regions of the electrically conductive layer 3. The partition walls 20 are made of copper, for example.

In the cross-sectional view shown in FIG. 9E, it can be seen that between two adjacent semiconductor chips 13, two partition walls 20 are formed at a distance from each other. This is advantageous, since the partition walls 20 are used here for the electrical contacting of the semiconductor chips 13.

Figure 9F:
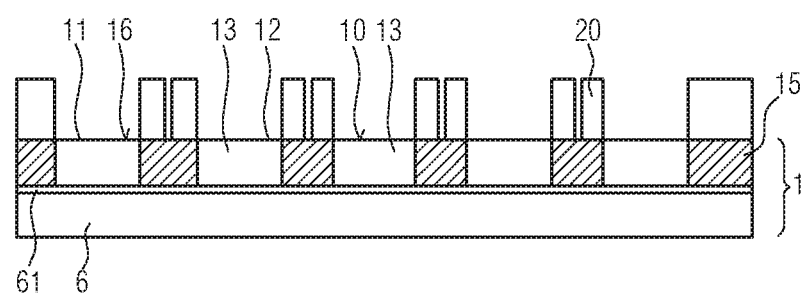

FIG. 9F shows a position in the method in which the electrically insulating layer 4 has been removed. In addition, the electrically conductive layer 3 is removed in the region of the emission fields 11, 12. For this purpose, the electrically conductive layer 3 has been etched away, for example, after removing the electrically insulating layer 4.

Figure 9G:
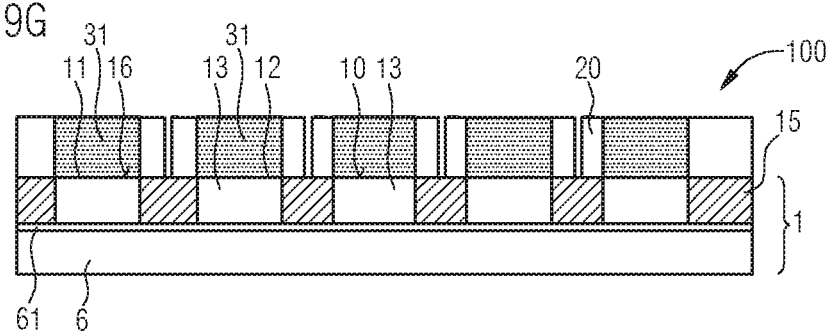

In FIG. 9G filling elements 31 in the form of conversion elements 31 are formed between the partition walls 20. For this purpose, for example, a liquid or viscous conversion material was again placed in the region between the partition walls 20 and then cured. FIG. 9G shows also a finished optoelectronic component 100 in cross-sectional view.

Figure 9H:
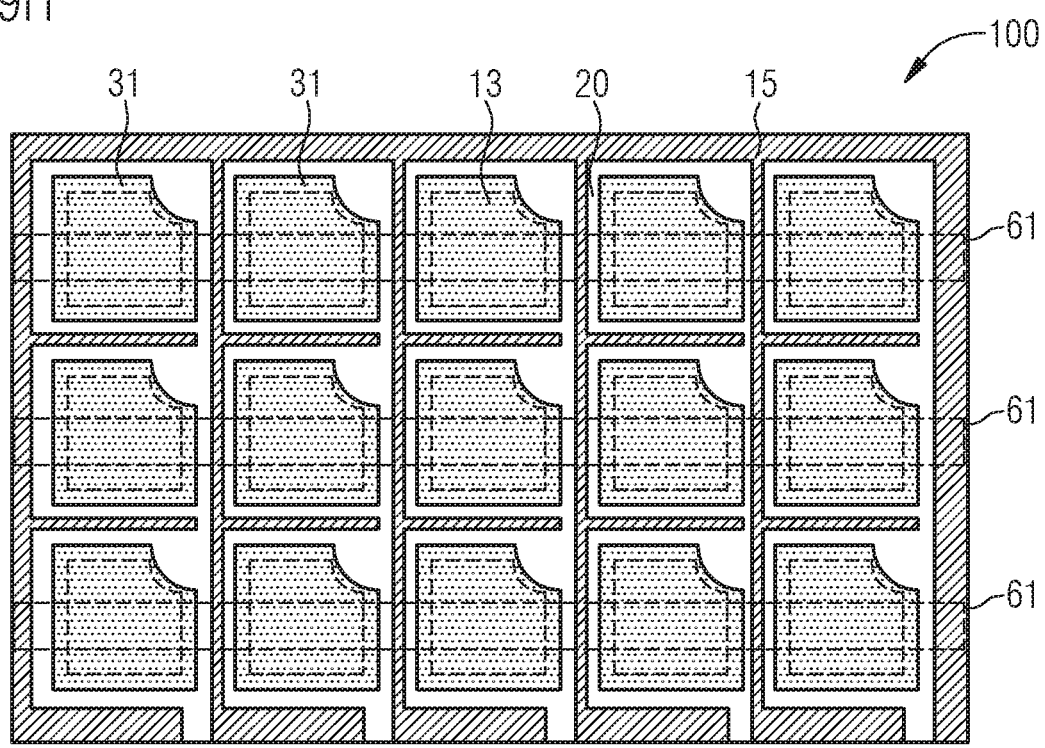

FIG. 9H shows the optoelectronic component 100 of FIG. 9G in a plan view of the emission side 10. It can again be seen that each conversion element 31 and the corresponding semiconductor chip 13 is surrounded by a mesh of partition walls 20. In this case, the partition walls 20 of a column of semiconductor chips 13 are electrically connected to each other. As a result, the semiconductor chips 13 are also electrically connected to one another along a column via the partition walls 20. Along a row of semiconductor chips 13, however, the partition walls 20 are electrically insulated from each other. Instead, conductor tracks 61 are provided between the semiconductor chips 13 and the carrier, which contact the semiconductor chips 13 in a row. A semiconductor chip 13 can be controlled and supplied with current in a targeted manner by electrically contacting a column via corresponding partition walls 20 and a row via a corresponding conductor track 61.

The invention is not limited to the description based on the exemplary embodiments. Rather, the invention comprises each new feature as well as each combination of features, which in particular includes each combination of features in the claims, even if these features or this combination itself is not explicitly stated in the claims or exemplary embodiments.

The invention claimed is:

1. An optoelectronic semiconductor chip comprising:
   a semiconductor layer sequence having an emission side, the emission side comprising a plurality of emission fields;
   partition walls on the emission side in a region between two adjacent emission fields; and
   a conversion element on one or more emission fields,
   wherein the conversion element comprises a matrix material with first phosphor particles incorporated therein,
   wherein the first phosphor particles are sedimented in the matrix material such that a mass fraction of the first phosphor particles is greater in a lower region of the conversion element facing the semiconductor layer sequence than in a remaining region of the conversion element, and
   wherein the partition walls are attached to the emission side without any additional connectors.

2. The optoelectronic semiconductor chip according to claim 1,
   wherein the mass fraction of the first phosphor particles in an upper region of the conversion element facing away from the semiconductor layer sequence is at most 75% of the mass fraction of the first phosphor particles in the lower region,
   wherein the lower region has a thickness of 10% of a total thickness of the conversion element, and
   wherein the upper region has a thickness of 10% of the total thickness of the conversion element.

3. The optoelectronic semiconductor chip according to claim 1, wherein the conversion element comprises scattering particles embedded in the matrix material.

4. The optoelectronic semiconductor chip according to claim 1, wherein the first phosphor particles comprise an inorganic phosphor.

5. The optoelectronic semiconductor chip according to claim 1,
   wherein some emission fields are each uniquely assigned to their respective conversion element, and
   wherein the partition walls project beyond the respective conversion elements in a direction away from the semiconductor layer sequence or terminate flush with the conversion elements.

6. The optoelectronic semiconductor chip according to claim 1, wherein a contiguous conversion element covers several emission fields.

7. The optoelectronic semiconductor chip according to claim 1, wherein the conversion element comprises second phosphor particles having a different phosphor than a phosphor of the first phosphor particles.

8. The optoelectronic semiconductor chip according to claim 7, wherein a mass fraction of the second phosphor particles in the lower region of the conversion element is smaller than in a remaining region of the conversion element.

9. The optoelectronic semiconductor chip according to claim 7, wherein the second phosphor particles comprise an organic phosphor.

10. The optoelectronic semiconductor chip according to claim 7, wherein the second phosphor particles are quantum dots.

11. The optoelectronic semiconductor chip according to claim 7, wherein the second phosphor particles have a lower density and/or a smaller average particle size than the first phosphor particles.

12. The optoelectronic semiconductor chip according to claim 1, wherein a plurality of different conversion elements with different conversion properties are located on the semiconductor layer sequence.

13. A method for manufacturing an optoelectronic component, the method comprising:
    providing an optoelectronic base element with an emission side, the emission side comprising a plurality of emission fields, wherein the base element is a contiguous semiconductor layer sequence;
    forming a plurality of partition walls on the emission side, wherein the partition walls form at least one mesh which surrounds an emission field when viewed in plan view of the emission side and thereby extends at least in sections between two adjacent emission fields;
    filling a region surrounded by the mesh of the partition walls with a liquid or viscous filling material; and
    curing the filling material to form a filling element.

14. The method according to claim 13, wherein the liquid or viscous filling material is a liquid or viscous conversion material, wherein the conversion material comprises a matrix material having first phosphor particles distributed therein, and wherein the first phosphor particles sediment in the matrix material so that a mass fraction of the first phosphor particles is greater in a lower region of the conversion material facing the emission side than in a remaining region of the conversion material.

15. The method according to claim 13, wherein forming the partition walls comprises forming reflective or absorbent partition walls.

16. The method according to claim 13, wherein forming the partition walls comprises forming the partition walls from a photoresist.

17. The method according to claim 16, wherein the partition walls of the photoresist form a photoresist mask, and wherein the method further comprises:
    removing the partition walls of the photoresist; and
    after removing the partition walls of the photoresist, arranging final partition walls in regions where the partition walls of the photoresist were previously formed.

18. The method according to claim 13, wherein forming the partition walls comprises galvanically growing the partition walls.

19. An optoelectronic component comprising:
    an optoelectronic base element with an emission side which is flat within manufacturing tolerances, the emission side comprising an emission field;
    a plurality of partition walls on the emission side, wherein the partition walls surround the emission field when viewed in plan view of the emission side; and
    a filling element, which is surrounded by the partition walls when viewed in plan view of the emission side and rests form-fittingly against the partition walls,
    wherein the partition walls comprise a photoresist and are not integrated with the optoelectronic base element, and
    wherein the filling element overlaps with the emission field surrounded by the partition walls when viewed in plan view of the emission side.

20. The optoelectronic component according to claim 19,
wherein the optoelectronic base element comprises a semiconductor chip arranged on a carrier and a potting around the semiconductor chip,
wherein the semiconductor chip comprises a radiation exit side,
wherein the radiation exit side together with a side of the potting facing away from the carrier forms at least part of the emission side,
wherein the radiation exit side of the semiconductor chip forms the emission field, and
wherein the partition walls on the emission side are formed in a region of the potting.

* * * * *